US 6,737,909 B2

(12) United States Patent
Jaussi et al.

(10) Patent No.: US 6,737,909 B2
(45) Date of Patent: May 18, 2004

(54) INTEGRATED CIRCUIT CURRENT REFERENCE

(75) Inventors: James E. Jaussi, Hillsboro, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/995,013

(22) Filed: Nov. 26, 2001

(65) Prior Publication Data

US 2003/0098735 A1 May 29, 2003

(51) Int. Cl.$^7$ ................ G05F 1/10; G05F 3/02
(52) U.S. Cl. .................... 327/541; 327/543
(58) Field of Search ................ 327/538, 540, 327/541, 543; 323/312, 315, 316

(56) References Cited

U.S. PATENT DOCUMENTS

| | | | | |
|---|---|---|---|---|
| 4,853,610 A | * | 8/1989 | Schade, Jr. | 323/316 |
| 5,563,782 A | * | 10/1996 | Chen et al. | 363/146 |
| 5,585,751 A | * | 12/1996 | Iizuka | 327/100 |
| 5,818,213 A | * | 10/1998 | Kim | 323/315 |
| 5,949,279 A | * | 9/1999 | Kwan | 327/545 |
| 6,275,090 B1 | * | 8/2001 | Burger et al. | 327/334 |
| 2002/0014914 A1 | * | 2/2002 | Perque et al. | 327/543 |
| 2002/0036536 A1 | * | 3/2002 | Wada et al. | 327/538 |
| 2002/0039044 A1 | * | 4/2002 | Kwak et al. | 327/540 |

OTHER PUBLICATIONS

Baker, R., et al., "CMOS: Circuit Design, Layout, and Simulation,", *IEEE Press*, 4 pages, (1998).
Filanovsky, I.M., "Voltage Reference Using Mutual Compensation of Mobility and Threshold Voltage Temperature Effects", *ISCAS 2000—IEEE International Symposium on Circuits and Systems*, pp. V197–V200, (May 2000).
Haycock, M., et al., "A 2.5Gb/s Bidirectional Signaling Technology", *Hot Interconnects Symposium V*, pp. 1–8, (Aug. 1997).
Lee, S. H., et al., "A Temperature and Supply Voltage Insensitive CMOS Current Reference", *IEICE Trans. Electron.*, vol. E82–C, No. 8, 1562–1566, Aug., 1999.).

* cited by examiner

*Primary Examiner*—Timothy P. Callahan
*Assistant Examiner*—Quan Tra
(74) *Attorney, Agent, or Firm*—Schwegman, Lundberg, Woessner & Kluth, P.A.

(57) ABSTRACT

A current reference with reduced sensitivity to process variations includes a variable resistor and a control transistor. The control transistor has a current from source-to-drain that is provided by a current mirror. The current mirror also provides a current to a variable resistor that is coupled gate-to-source to the control transistor. A control loop circuit measures the reference current provided by the current mirror and modifies the resistance value of the variable resistor in response. An external precision resistor is used to measure the reference current, and current variations as a result of process variations are reduced.

30 Claims, 6 Drawing Sheets

INTEGRATED CIRCUIT CURRENT REFERENCE

FIELD

The present invention relates generally to current references, and more specifically to current references that provide substantially constant current.

BACKGROUND

Current references are circuits that are designed to provide constant current. The constant current is utilized in other circuits, and the design of these other circuits typically relies on the current being constant. One problem with current references is that the current provided can be sensitive to voltage, temperature, and process variations. That is to say, as the voltage, temperature, or process parameters (such as transistor threshold voltages) vary, the current generated by the current reference also varies.

A prior art current reference that is process and temperature dependent is shown in FIG. 21.7 of R. Jacob Baker et al., "CMOS Circuit Design, Layout, and Simulation," (IEEE Press 1998). As described, the accuracy of the reference current of this circuit is limited by the threshold voltage accuracy (process dependent); and the reference current has a large negative temperature coefficient (temperature dependent).

Sensitivity to temperature and power supply voltage variations in current references, and the reduction thereof, has been the subject of much study. See, for example, Sueng-Hoon Lee and Yong Jee, "A Temperature and Supply-Voltage Insensitive CMOS Current Reference," IEICE Trans. Electron., Vol.E82-C, No.8 August 1999.

Sensitivity to process variations has been historically handled by design margins. For example, if, over expected process variations, a current generated by a current reference can vary by a factor of two, the current reference is typically designed to have a nominal current equal to twice the minimum specified value so that under worst case conditions, the minimum current value is guaranteed to exist. Power is wasted as a result, in part because the nominal current value is twice what is needed.

For the reasons stated above, and for other reasons stated below which will become apparent to those skilled in the art upon reading and understanding the present specification, there is a need in the art for a current reference with reduced sensitivity to voltage, temperature, and process variations.

DESCRIPTION OF EMBODIMENTS

Figure 1A:
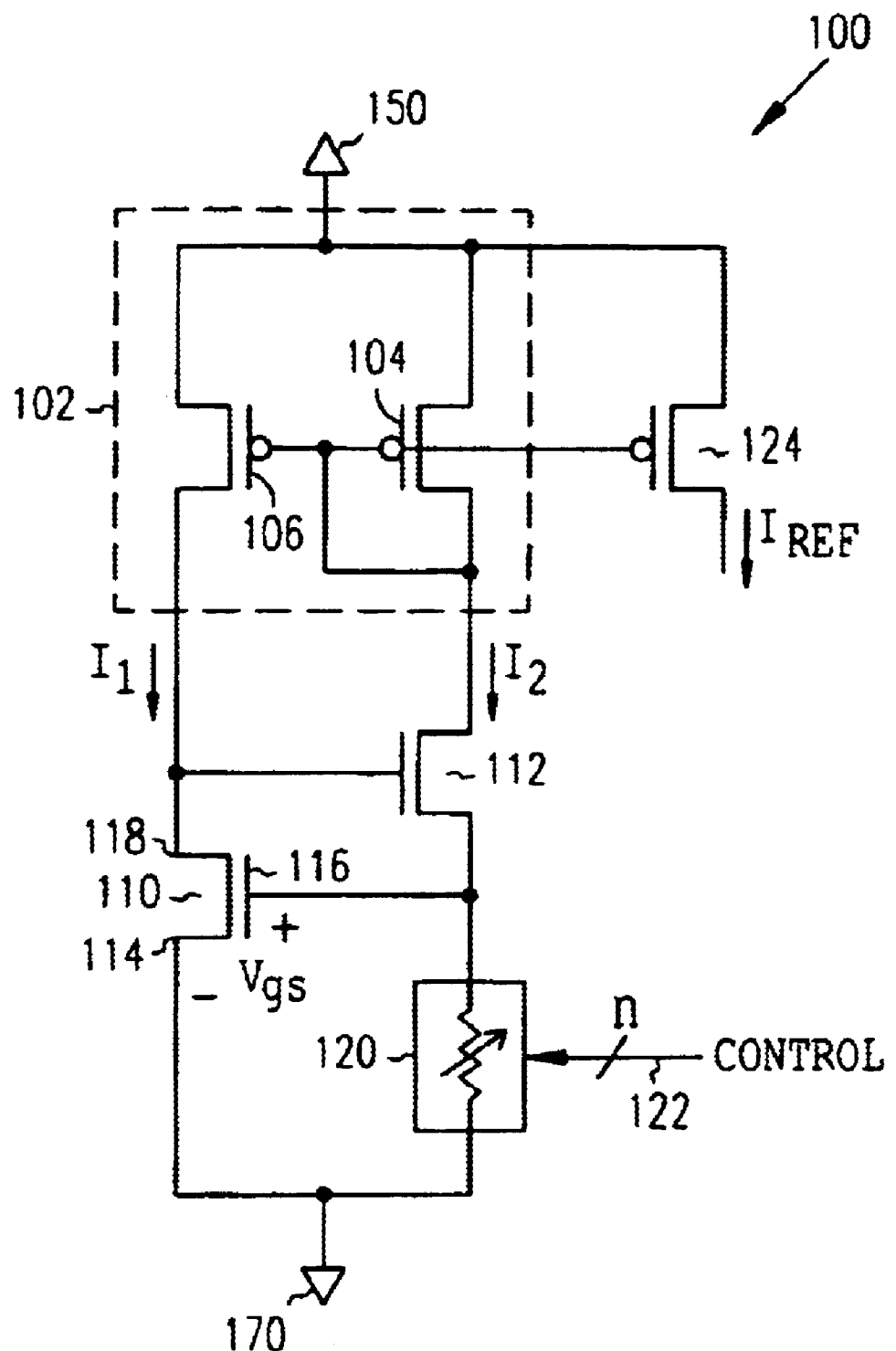
FIGS. 1A and 1B show current references with variable resistors.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to reduce a current reference's sensitivity to supply voltage, temperature, and process variations. A current mirror provides two substantially constant currents in two different current paths. The first current path includes a variable resistor. The second current path includes a control transistor coupled from gate-to-source to the variable resistor. The reference current provided by the current reference is a function of the gate-to-source voltage of the control transistor, which is in turn a function of the voltage drop across the variable resistor. A control loop circuit measures the reference current and modifies the resistance value of the variable resistor in response. An external precision resistor is used to measure the generated current, and current variations as a result of supply voltage, temperature, and process variations are reduced.

FIG. 1A shows a current reference circuit. Current reference circuit 100 includes current mirror 102, control transistor 110, variable resistor 120, transistor 112 and reference current transistor 124.

Variable resistor 120 is a variable resistor with a resistance value that changes responsive to signals on control input bus 122. A number "n" of control signals are represented in FIG. 1A, however, any number of control signals can be utilized. The resistance value of resistor 120 is modified by changing signal values present on control input bus 122. Variable resistor 120 is coupled between lower power supply node 170 and transistor 112. Example implementation embodiments of variable resistor 120 and the control of its resistance value are explained in more detail below with reference to figures that follow.

Control transistor 110 is an n-channel transistor with source 114, gate 116, and drain 118. Source 114 is coupled to lower power supply node 170. Gate 116 receives a gate-to-source voltage ($V_{gs}$) equal to the voltage drop across variable resistor 120, and drain 118 is coupled to current mirror 102. Gate 116 and source 114 are "biasing terminal" of control transistor 110, and $V_{gs}$ is a biasing voltage applied across the biasing terminals. In embodiments represented by FIG. 1A, control transistor 110 is an n-channel metal oxide semiconductor field effect transistor (NMOSFET). In other embodiments, other types of transistors are used. For example, in some embodiments, junction field effect transistors (JFET) are used, and in other embodiments, bipolar junction transistors (BJT) are used. Embodiments that utilize BJTs and JFETs include transistors with biasing terminals similar in function to those shown in FIG. 1A. As used herein, the term "NFET" refers to any transistor having an n-doped channel. Control transistor 110 is an example of a NFET.

In some embodiments, control transistor 110 is a "long channel" device. A long channel device is one that has a channel from source-to-drain that is longer than the minimum dimension for the process in which it is manufactured. Using long channels can aid in avoiding process variations related to small lateral dimensions. Short channel devices can also be used. When short channel devices are used, circuit analysis can become more complicated in part because certain assumptions cannot be made.

Current mirror 102 includes diode-connected transistor 104 and second transistor 106. The term "diode-connected" as used herein, refers to a transistor that has a gate tied to a drain, such that the gate-to-source voltage and the drain-to-source voltage are equal. Each transistor in current mirror 102 provides a current to one of two "legs" in the circuit. For example, transistor 106 provides current $I_1$ in one leg of the current mirror, and transistor 104 provides current $I_2$ in a second leg of the current mirror. Current $I_2$ ("generated current"), as shown in FIG. 1A, is substantially equal to current $I_1$. In other embodiments, diode-connected transistor 104 and second transistor 106 are sized such that currents $I_1$ and $I_2$ are related, but are not equal. Many embodiments of current mirror 102 exist. In some embodiments, current mirror 102 is implemented as a bipolar transistor current mirror. In other embodiments, current mirror 102 is implemented using junction field effect transistors (JFETs). In embodiments represented by FIG. 1A, current mirror 102 is implemented using p-channel metal oxide semiconductor field effect transistors (PMOSFETs). Current mirror 102 can be implemented in many other ways without departing from the scope of the present invention.

The combination of control transistor 110 and variable resistor 120 set the value of both currents $I_1$ and $I_2$. The action of current mirror 102 forces currents $I_1$ and $I_2$ to be substantially equal. Current $I_2$ passes through variable resistor 120, and a voltage drop results. The voltage drop across variable resistor 120 sets the gate-to-source voltage ($V_{gs}$) of control transistor 110, which in turn determines the value of current $I_1$. Transistor 112 is coupled drain-to-source between diode-connected transistor 104 and variable resistor 120. Transistor 112 can support a varying drain-to-source voltage, thereby allowing the voltage drop across variable resistor 120 to vary as appropriate.

Figure 5:
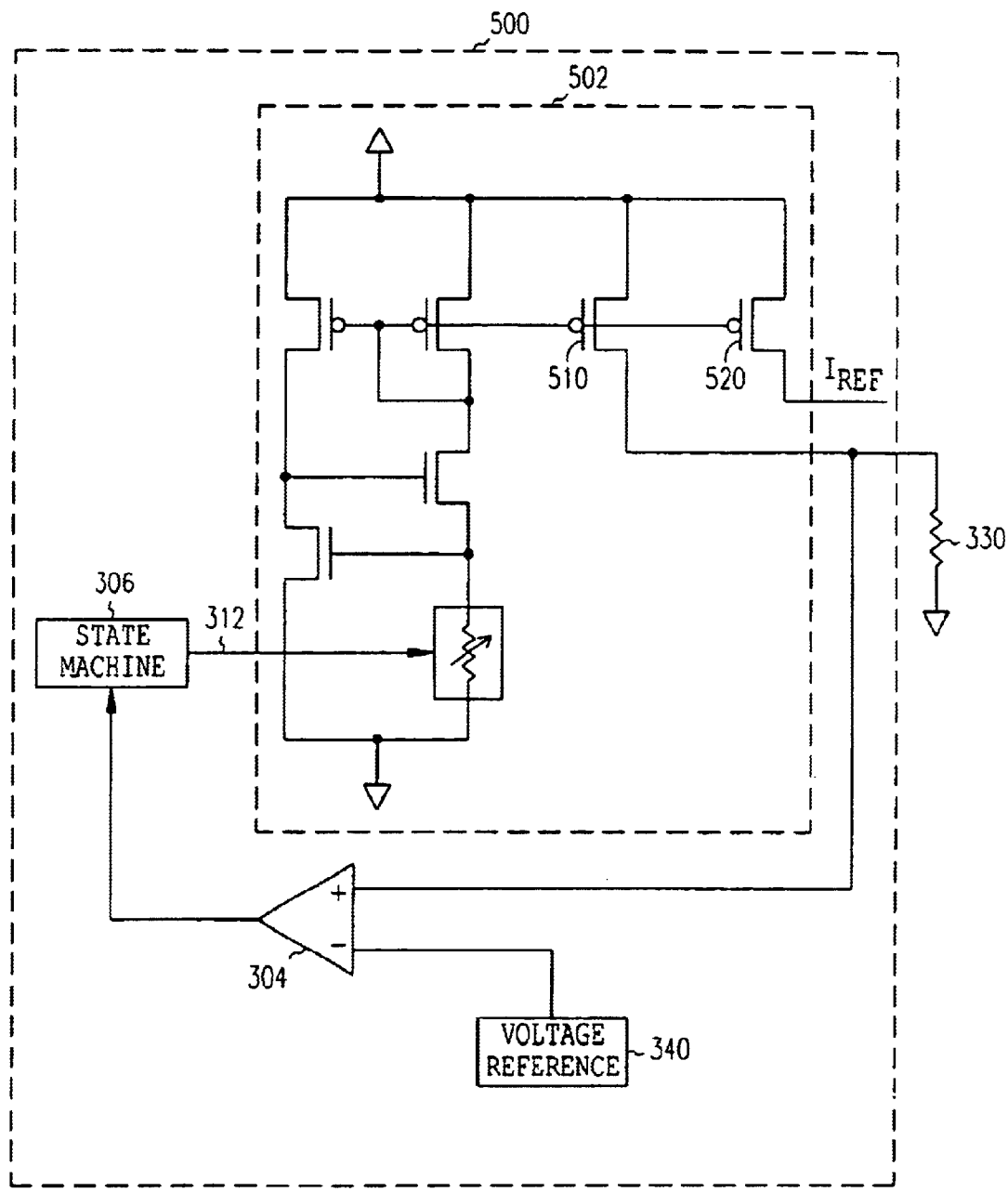
FIG. 5 shows another integrated circuit having a current reference and a control loop circuit.

Reference current transistor 124 is coupled to current mirror 102 to produce the output current, or "reference current," shown in FIG. 1A as $I_{REF}$. In some embodiments, multiple reference transistors 124 are coupled in parallel to provide multiple reference currents. Some of these embodiments are represented by FIG. 5, which is discussed below. Parallel reference current transistors such as those shown in FIG. 5 can be sized to provide reference currents of differing values.

Various embodiments of current reference 100 have been described with n-channel control transistors and current mirrors that include p-channel transistors. Other embodiments have p-channel control transistors and current mirrors that include n-channel transistors. In these embodiments, variable resistors and control transistors are coupled to an upper power supply node rather than a lower power supply node.

Figure 1B:
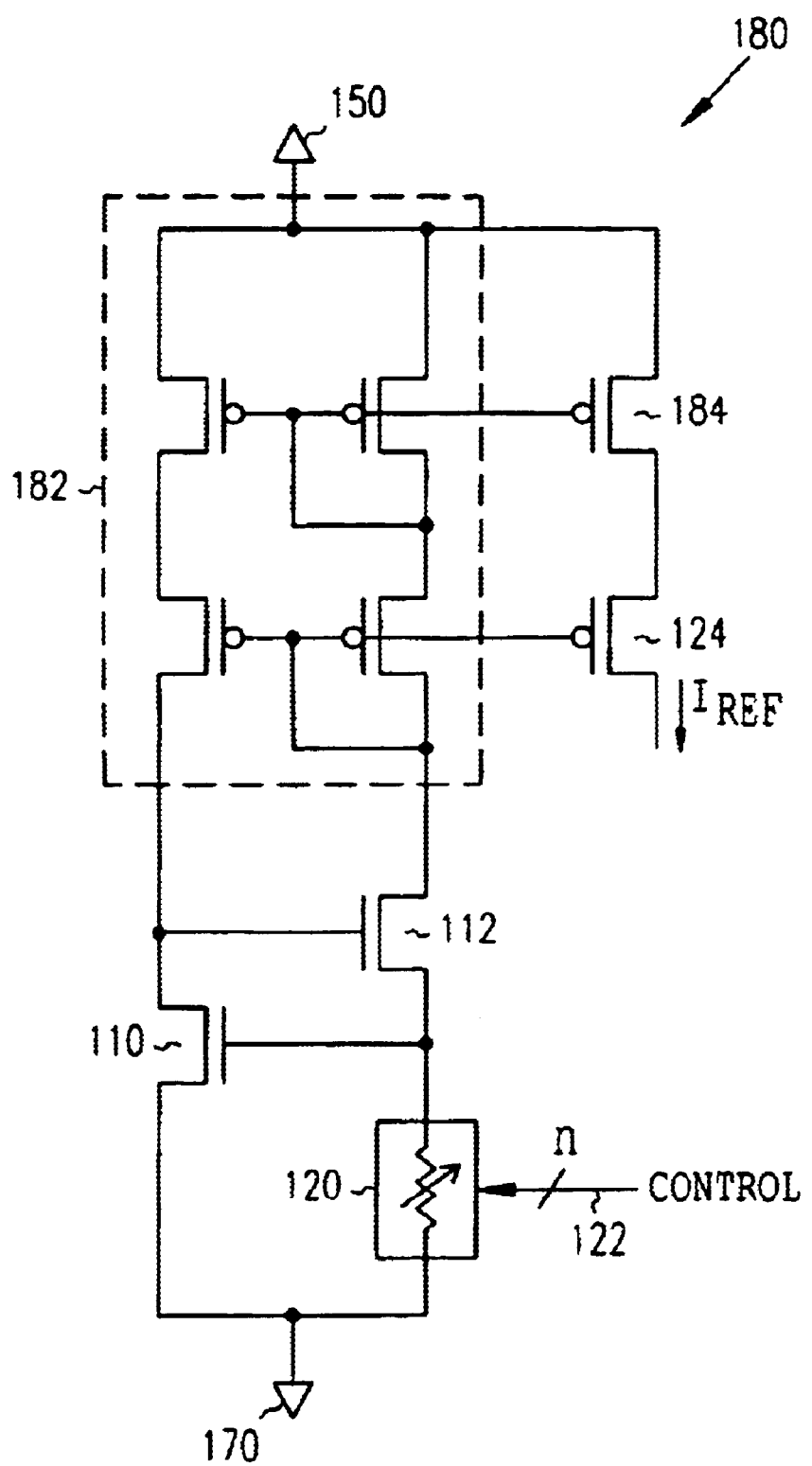

FIG. 1B shows a current reference circuit 180 with a cascode current mirror and cascoded reference current transistors. Cascode current mirror 182 provides further supply voltage independence, and cascoded reference current transistors 184 and 124 provide a higher output impedance.

Figure 2:
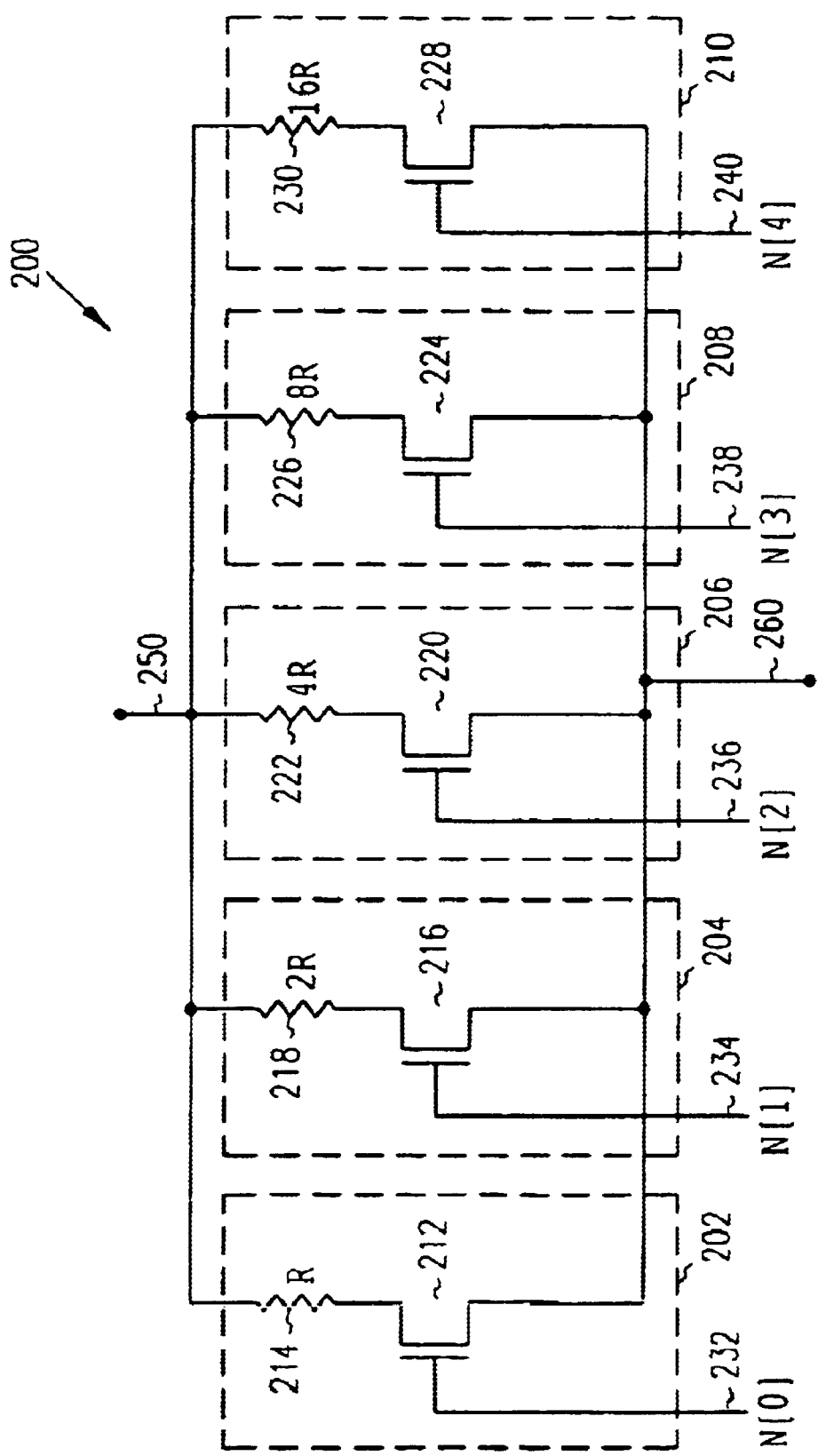
FIG. 2 shows a variable resistor.

FIG. 2 shows a variable resistor. Variable resistor 200 includes multiple resistive devices, each having a control input node. For example, variable resistor 200 includes resistive devices 202, 204, 206, 208, and 210. Each of the resistive devices includes a transistor and a fixed value resistor. For example, resistive device 202 includes NFET 212 and resistor 214. Likewise, resistive devices 204, 206, 208, and 210 include NFETs 216, 220, 224, and 228 and resistors 218, 222, 226, and 230, respectively.

Each resistive device is coupled in parallel between two reference nodes 250 and 260. Each resistive device includes a control input node having a signal that either turns on or turns off the NFET. For example, NFET 212 within resistive device 202 has a gate driven with the signal on control node 232. Likewise, control nodes 234, 236, 238, and 240 provide control signals to NFETs 216, 220, 224, and 228, respectively.

The resistors within the resistive devices can be any type of resistor fabricated on an integrated circuit. In some embodiments, resistors are fabricated as n-well resistors, as is known in the art. In the embodiment shown in FIG. 2, the resistive devices have binary weighted resistance values. For example, resistor 214 has a resistance value of "r," and resistor 214 has a resistance value of "2r." The resistance values double for each resistive device, and the largest resistance value of "16r" exists in resistance element 210.

In some embodiments, the resistance values of the resistors can vary over process. For example, when resistors 214, 218, 222, 226, and 230 are fabricated as n-well resistors, the resistance values are variable to the extent that the process varies. For any given device, however, the relative resistance values of resistors 214, 218, 222, 226, and 230 are substantially constant, thereby allowing a desired resistance value to be obtained by controlling NFETs 212, 216, 220, 224, and 228.

Control input nodes 232, 234, 236, 238, and 240, taken together, form a control bus. In the embodiment of FIG. 2, this control bus is driven by a five bit wide signal labeled N[4:0]. The generation of this five bit wide signal is explained further with reference to later figures. By varying which control signals are asserted, 31 different resistance values can be obtained between nodes 250 and 260.

Variable resistor 200 utilizes n-channel transistors, and is useful to implement resistors with voltages closer to a negative voltage reference than to a positive voltage reference. For example, variable resistor 200 can be utilized for variable resistor 120 (FIGS. 1A and 1B). When variable resistor 200 is utilized for variable resistor 120, the five bit wide control bus of FIG. 2 corresponds to control input bus 122.

In other embodiments, variable resistor 200 utilizes p-channel transistors. These embodiments can be utilized for variable resistors with voltages closer to a positive voltage reference. For example, such a variable resistor can be useful in current reference embodiments that include p-channel control transistors.

Variable resistor 200 has been described with resistive devices, each including a resistor with a binary weighting relative to the other resistors. Any number of resistive devices can be included without departing from the scope of the present invention. Binary weighting can be maintained with a large number of resistive devices, or a linear weighting can be employed. For example, variable resistor 200 can be implemented with each resistive device including a resistor of equal value. This reduces the number of possible resistance values available, but also reduces the possibility of a transient resistance value appearing when signal values on the input bus change.

Figure 3:
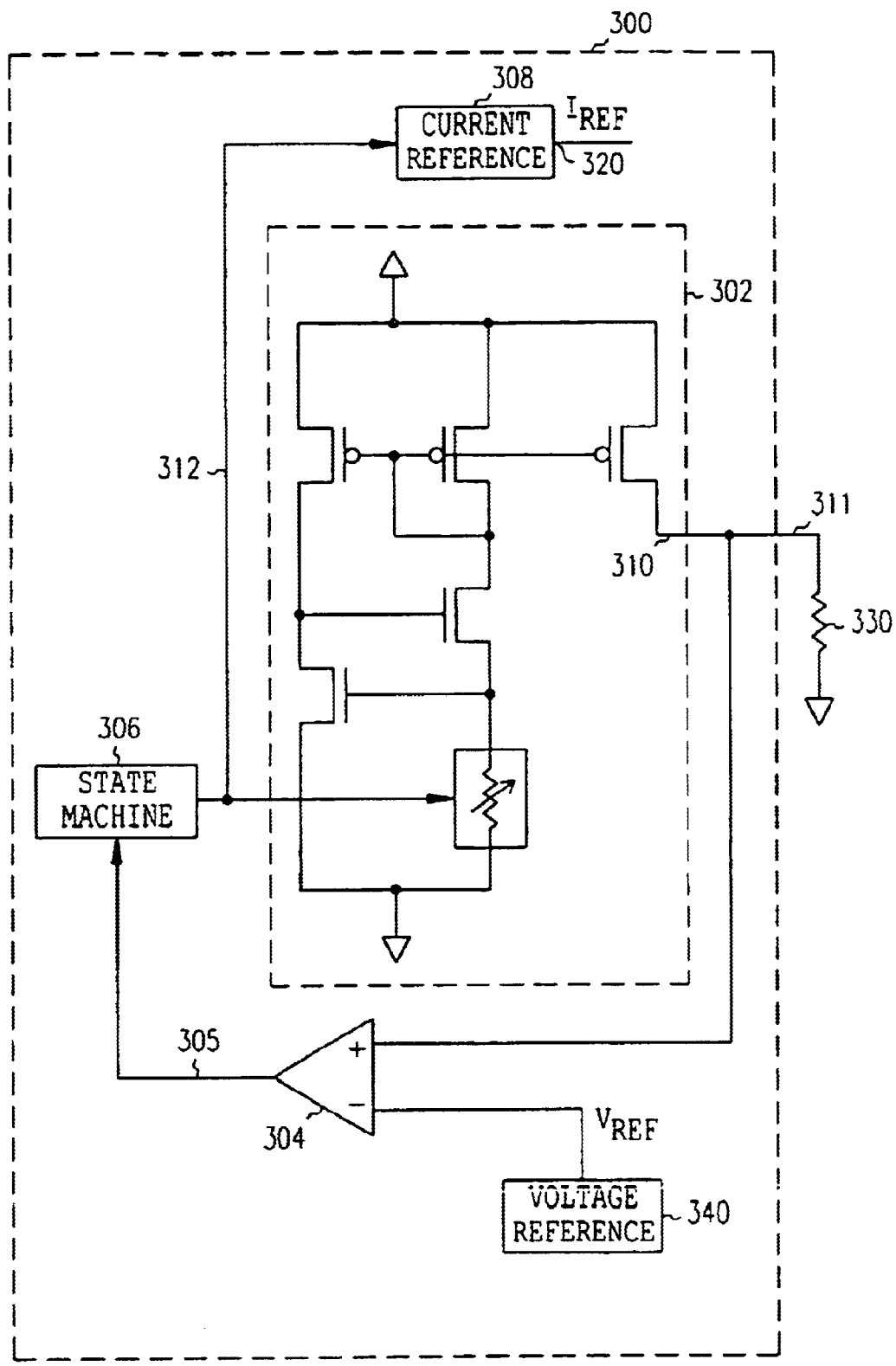
FIG. 3 shows an integrated circuit having a current reference and a control loop circuit.

FIG. 3 shows an integrated circuit having a current reference and a control loop circuit. Integrated circuit 300 includes two current references 302 and 308, voltage reference 340, voltage comparator 304, and state machine 306. Current reference 302 is shown implemented as current reference 100 (FIG. 1A). The variable resistor within current reference 302 is driven by control signals generated by state machine 306 on node 312. Current reference 302, voltage comparator 304, and state machine 306 form a control loop circuit that modifies the resistance value of the variable resistor within current reference 302. Also shown in FIG. 3 is resistor 330, which is external to integrated circuit 300. High precision resistors are readily available, and resistor 330 can be a high precision resistor selected for a particular application of integrated circuit 300.

Current source 302 generates a reference current on node 310 as described with reference to the previous figures. Integrated circuit 300 includes output node 311, which is coupled to an external resistor 330. The reference current travels through resistor 330 and generates a voltage. This voltage is compared against the reference voltage ($V_{REF}$) by voltage comparator 304. The reference voltage can be kept substantially constant using known methods. One known method is shown in I. M. Filanovsky, "Voltage Reference Using Mutual Compensation of Mobility and Threshold Voltage Temperature Effects," 197–200, ISCAS 2000, May 28–31, 2000, Geneva, Switzerland. In embodiments represented by FIG. 3, a single output node 311 is utilized to output the reference current and also to sample a voltage to be compared. In some embodiments, integrated circuit 300 includes a separate input node to sample an external voltage. In these embodiments, the reference current is output on node 311, and an external voltage is sampled on a separate input node.

In some embodiments, voltage comparator 304 produces a digital output on node 305, which is input to state machine 306. In some embodiments, state machine 306 includes a counter that counts up or down depending on the value of the digital signal on node 305. As state machine 306 counts up or down, control signals on node 312 modify resistance values of variable resistors within current references 302 and 308. As a result of the change in resistance values, current reference 302 modifies the current on output node 310, and the loop is closed. In this manner, the control loop circuit is responsive to a reference current that is a copy of a generated current within current reference 302. By utilizing variable resistors within current references 302 and 308, resistance values can be trimmed to match, or to be a function of, the resistance of an external precision resistor.

Integrated circuit 300 includes two current references 302 and 308. The output current from current reference 302 is utilized to close the control loop that generates control signals on node 312. Current reference 308 receives the control signals on node 312 and produces a current reference output current (shown as "$I_{REF}$" in FIG. 3) on node 320.

Any number of current references can utilize the control signals on node 312. One current reference, current reference 302, is used to close the control loop circuit, but many more current references can utilize control signals generated thereby.

Figure 4:
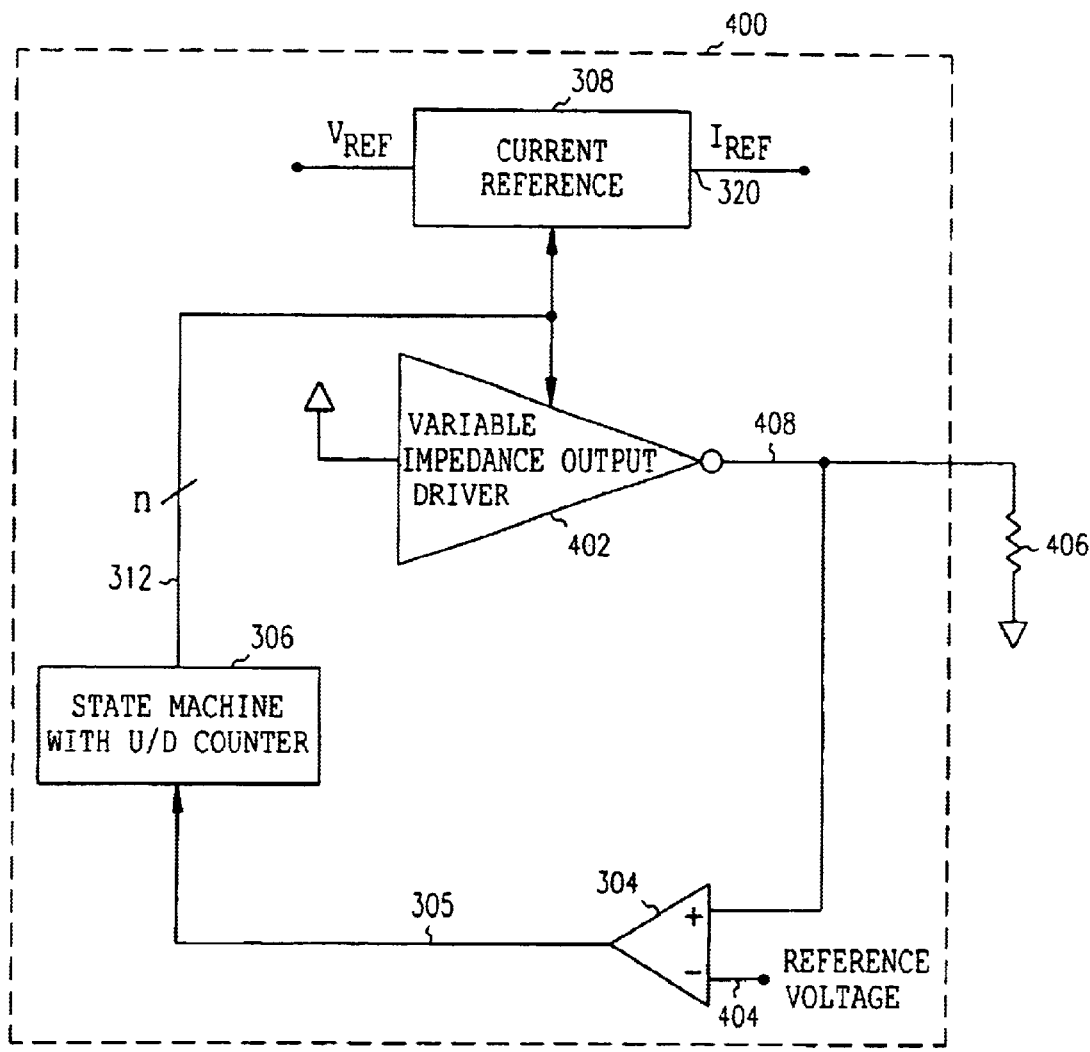
FIG. 4 shows an integrated circuit having a current reference and a variable impedance output driver sharing a common control loop circuit.

FIG. 4 shows an integrated circuit having a current reference and a variable impedance output driver sharing a common control loop circuit. Integrated circuit 400 includes current reference 308, voltage comparator 304, and state machine 306. Integrated circuit 400 also includes variable impedance output driver 402. In the embodiment of FIG. 4, the control loop circuit does not include current reference 308, but instead includes variable impedance output driver 402.

In operation, the output impedance of variable impedance output driver 402 is modified by control signals on node 312. The voltage on node 408 is a function of external resistor 406 and the output impedance of driver 402. Voltage comparator 304 compares the voltage on node 408 with the reference voltage on node 404 and generates a signal on node 305, which is input to state machine 306. When the output impedance of driver 402 is at a proper value, the loop is locked, and signals on node 312 change more slowly, or not at all. Current reference 308 utilizes the control signals on node 312 to modify internal resistances, thereby providing a substantially constant output current on node 320.

An example control loop circuit that includes a variable impedance output driver, voltage comparator, and a state machine, is described in M. Haycock and R. Mooney, "A 2.5 Gb/s Bidirectional Signaling Technology," Hot Interconnect Symposium V, Aug. 21–23, 1997.

Integrated circuit 400 utilizes a single external resistor in a control loop to set the values of multiple internal components. For example, current reference 308 includes internal variable resistors with resistance values set, and variable impedance output driver 402 has an impedance set. Any number of components internal to integrated circuit 400 can be modified by the control signals generated in the control loop circuit that uses the external resistor. In this manner, a single external resistor can be shared among many internal components.

FIG. 5 shows another integrated circuit having a current reference and a control loop circuit. Integrated circuit 500 includes current reference 502, state machine 306, comparator 304, and voltage reference 340. Current reference 502 includes two reference current transistors 510 and 520, whereas both current reference 302 (FIG. 3) and current reference 100 (FIG. 1A) include one reference current transistor. In embodiments represented by FIG. 5, reference current transistor 510 provides a current that generates a voltage across resistor 330, and reference current transistor 520 provides the reference current ($I_{REF}$).

Integrated circuits 300 (FIG. 3), 400 (FIG. 4), and 500 (FIG. 5) can be any integrated circuit capable of including a current reference such as current references 100 or 180 (FIGS. 1A and 1B). Integrated circuits 300, 400, and 500 can be a processor such as a microprocessor, a digital signal processor, a microcontroller, or the like. Integrated circuits 300, 400, and 500 can also be an integrated circuit other than a processor such as an application-specific integrated circuit (ASIC), a communications device, a memory controller, or a memory such as a dynamic random access memory (DRAM).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A current reference comprising:
   a current mirror circuit to force a first current to be substantially equal to a second current;
   a control transistor coupled to the current mirror circuit to receive the first current, the control transistor having first and second biasing terminals across which a biasing voltage can be applied;
   a variable resistor including a plurality of parallel binary weighted transistors coupled between the first and second biasing terminals of the control transistor and coupled to the current mirror to receive the second current; and a control loop responsive to a generated current equal to one of the first and second currents to influence the biasing voltage.

2. A current reference comprising:

a current mirror circuit to force a first current to be substantially equal to a second current;

a control transistor coupled to the current mirror circuit to receive the first current, the control transistor having first and second biasing terminals across which a biasing voltage can be applied;

a variable resistor coupled between the first and second biasing terminals of the control transistor and coupled to the current mirror to receive the second current; and a control loon responsive to a generated current equal to one of the first and second currents to influence the biasing voltage, wherein the variable resistor comprises a plurality of resistive devices in parallel, each of the plurality of resistive devices having a control input node to enable the resistive device.

3. A current reference comprising:

a current mirror circuit to force a first current to be substantially equal to a second current;

a control transistor coupled to the current mirror circuit to receive the first current, the control transistor having first and second biasing terminals across which a biasing voltage can be applied;

a variable resistor coupled between the first and second biasing terminals of the control transistor and coupled to the current mirror to receive the second current; and a control loop responsive to a generated current equal to one of the first and second currents to influence the biasing voltage, wherein the variable resistor includes a plurality of resistive devices having binary weighted values.

4. The current reference of claim 3 wherein the plurality of resistive devices are coupled in parallel, each of the plurality of resistive devices having a control input node to enable the resistive device.

5. The current reference of claim 4 wherein the control loop circuit includes output nodes, and wherein the control input node of each resistive device is coupled to one of the output nodes of the control loop circuit.

6. A current reference comprising:

a current mirror circuit to force a first current to be substantially equal to a second current;

a control transistor coupled to the current mirror circuit to receive the first current, the control transistor having first and second biasing terminals across which a biasing voltage can be applied;

a variable resistor coupled between the first and second biasing terminals of the control transistor and coupled to the current mirror to receive the second current; and a control loop circuit to influence the variable resistor, wherein the variable resistor comprises a plurality of resistive devices in parallel, each of the plurality of resistive devices having a control input node to enable the resistive device, wherein the control loop circuit comprises:

a comparator to compare two voltages, the comparator having an output node; and a state machine coupled to the output node of the comparator, the state machine having output nodes coupled to the control input nodes of the plurality of resistive devices.

7. The current reference of claim 6 wherein the control transistor comprises a NFET, and the first and second biasing terminals are a gate source of the NFET.

8. The current reference of claim 7 further comprising a second NFET having a drain terminal coupled to receive the second current from the current mirror, and having a source terminal coupled to provide the second current to the variable resistor.

9. The current reference of claim 6 further comprising a transistor coupled drain-to-source between the current mirror and the variable resistor.

10. An integrated circuit comprising:

a first current reference having a first current mirror with first and second current paths, a first control transistor coupled in the first current path, and a first variable resistor coupled in the second current path and across biasing terminals of the first control transistor, the first current reference having an output node with substantially constant current;

a second current reference having a second current mirror with third and fourth current paths, a second control transistor coupled in the third current path, and a second variable resistor coupled in the fourth current path and across biasing terminals of the second control transistor; and a control loop circuit having an input node coupled to an output node of the second current reference, and having an output node to influence the first and second variable resistors.

11. The integrated circuit of claim 10 further comprising a voltage reference having an output node coupled to a second input node of the control loop circuit.

12. The integrated circuit of claim 11 wherein the control loop circuit comprises a comparator responsive to the second current reference and the voltage reference.

13. The integrated circuit of claim 12 wherein the control loop circuit further comprises a state machine to influence the first and second variable resistors responsive to the comparator.

14. The integrated circuit of claim 12 further comprising an output node coupled to the output node of the second current reference to drive a resistor external to the integrated circuit, and an input node coupled to the comparator to sample an external voltage on the external resistor.

15. The integrated circuit of claim 10 wherein the first current mirror comprises two PFET devices.

16. The integrated circuit of claim 10 wherein the first variable resistor includes a first plurality of resistive devices in parallel, each of the first plurality of resistive devices including an NFET and an n-well resistor.

17. The integrated circuit of claim 16 wherein the second variable resistor includes a second plurality of resistive devices in parallel, each of the second plurality of resistive devices including an NFET and an n-well resistor.

18. The integrated circuit of claim 17 wherein the control loop circuit is coupled to a gate of the NFET in each of the second plurality of resistive devices.

19. The integrated circuit of claim 18 wherein the first and second control transistors are NFET devices.

20. The integrated circuit of claim 10 wherein the first current reference further comprises a transistor coupled in the second current path between the first current mirror and the first variable resistor.

21. A current reference comprising:

a control transistor having a gate terminal and a source terminal;

a variable resistor including a plurality of parallel resistive devices coupled across the gate terminal and source terminal of the control transistor, the variable resistor coupled to receive a generated current;

a control loop circuit responsive to a current equal to the generated current, the control loop circuit coupled to influence the generated current; and a current mirror coupled to the control transistor and the variable resistor.

22. The current reference of claim 21 wherein the current mirror includes a diode-connected transistor.

23. A current reference comprising:

a control transistor having a gate terminal and a source terminal;

a variable resistor coupled across the sate terminal and source terminal of the control transistor, the variable resistor coupled to receive a generated current;

a control loop circuit responsive to a current equal to the generated current, the control loop circuit coupled to influence the generated current; and a current mirror coupled to the control transistor and the variable resistor, wherein the variable resistor comprises a plurality of variable resistance devices coupled in parallel, each of the plurality of variable resistance devices including an NFET responsive to the control loop circuit.

24. The current reference of claim 23 wherein the control loop circuit comprises a comparator responsive to an output node of the current mirror.

25. The current reference of claim 24 wherein the control loop circuit comprises a state machine responsive to the comparator to influence the variable resistor.

26. The current reference of claim 23 further comprising a transistor to support a variable voltage between the current mirror and the variable resistor.

27. An integrated circuit comprising:

a control transistor coupled in a first leg of a current reference circuit, the control transistor having first and second biasing terminals;

a variable resistor including a plurality of parallel binary weighted transistors coupled in a second leg of the current reference circuit and between the first and second biasing terminals of the control transistor;

a control loop circuit to modify a resistance value of the variable resistor, the control loop circuit comprising a variable impedance output driver; and a current mirror coupled to the control transistor and the variable resistor.

28. An integrated circuit comprising:

a control transistor coupled in a first leg of a current reference circuit, the control transistor having first and second biasing terminals;

a variable resistor coupled in a second leg of the current reference circuit and between the first and second biasing terminals of the control transistor; and a control loop circuit to modify a resistance value of the variable resistor, the control loop circuit comprising a variable impedance output driver, a comparator coupled to an output node of the variable impedance output driver, and a state machine responsive to the comparator.

29. The integrated circuit of claim 28 wherein the variable resistor comprises a plurality of variable resistance devices coupled in parallel, each of the plurality of variable resistance devices including an NFET responsive to the state machine.

30. An integrated circuit comprising:

a control transistor coupled in a first leg of a current reference circuit, the control transistor having first and second biasing terminals;

a variable resistor coupled in a second leg of the current reference circuit and between the first and second biasing terminals of the control transistor;

a control loop circuit to modify a resistance value of the variable resistor, the control loop circuit comprising a variable impedance output driver; and an output node responsive to the variable impedance output driver to drive a resistor external to the integrated circuit, and an input node to sample an external voltage on the external resistor, and wherein the control loop circuit comprises:

a voltage comparator to compare the external voltage and an internal voltage; and a state machine responsive to the voltage comparator to influence the variable resistor.

* * * * *

UNITED STATES PATENT AND TRADEMARK OFFICE
CERTIFICATE OF CORRECTION

PATENT NO. : 6,737,909 B2
DATED : May 18, 2004
INVENTOR(S) : Jaussi et al.

It is certified that error appears in the above-identified patent and that said Letters Patent is hereby corrected as shown below:

Title page,
Item [56], References Cited, U.S. PATENT DOCUMENTS,
delete "3/2002" and insert -- 8/2001 --, therefor
Reference Cited, OTHER PUBLICATIONS, "Lee, S. H., et al." references, insert -- ( -- before "Aug.", after "1999" delete ".".

"*Primary Examiner*", delete "Timothy P. Callahan" and insert -- Terry D. - Cunningham --, therefor.

Column 7,
Line 18, delete "loon" and insert -- loop --, therefor.

Column 9,
Line 16, delete "sate" and insert -- gate --, therefor.

Signed and Sealed this

Thirtieth Day of November, 2004

JON W. DUDAS
*Director of the United States Patent and Trademark Office*